(12) United States Patent
Chao

(10) Patent No.: US 8,537,091 B2
(45) Date of Patent: Sep. 17, 2013

(54) FLAT PANEL DISPLAY

(75) Inventor: Chih-Chung Chao, Hsinchu County (TW)

(73) Assignee: Au Optronics Corporation, Hsinchu (TW)

( * ) Notice: Subject to any disclaimer, the term of this patent is extended or adjusted under 35 U.S.C. 154(b) by 1073 days.

(21) Appl. No.: 12/203,152

(22) Filed: Sep. 3, 2008

(65) Prior Publication Data

US 2009/0289885 A1 Nov. 26, 2009

(30) Foreign Application Priority Data

May 23, 2008 (TW) .............................. 97119183 A

(51) Int. Cl.
G02F 1/1345 (2006.01)
(52) U.S. Cl.
USPC .............................. 345/98; 349/149; 345/87
(58) Field of Classification Search
USPC ............................ 345/87–104; 349/149–152
See application file for complete search history.

(56) References Cited

U.S. PATENT DOCUMENTS

| 6,300,997 B1 * | 10/2001 | Saito et al. | 349/149 |
| 6,472,820 B1 * | 10/2002 | Mo | 313/581 |
| 2004/0090584 A1 * | 5/2004 | Mai | 349/149 |
| 2004/0156006 A1 * | 8/2004 | Uehara | 349/145 |
| 2005/0183884 A1 * | 8/2005 | Su | 174/257 |
| 2007/0132707 A1 * | 6/2007 | Choi et al. | 345/102 |
| 2008/0291380 A1 * | 11/2008 | Sakikubo | 349/150 |

FOREIGN PATENT DOCUMENTS

| TW | I220169 | 8/2004 |
| TW | I223120 | 11/2004 |
| TW | I240819 | 10/2005 |
| TW | 200535761 | 11/2005 |

OTHER PUBLICATIONS

"Office Action of Taiwan Counterpart Application", issued on Sep. 28, 2011, p. 1-p. 8, in which the listed references were cited.

* cited by examiner

Primary Examiner — Stephen Sherman
(74) Attorney, Agent, or Firm — Jianq Chyun IP Office

(57) ABSTRACT

A flat panel display includes a display screen, a first flexible printed circuit, and a second flexible printed circuit. The second flexible printed circuit has a plurality of pads and is electrically connected to the display screen. The first flexible printed circuit is electrically connected between the display screen and the second flexible printed circuit and has a plurality of pins corresponding to the pads. The pins are divided into a plurality of groups, and each the group is respectively located at the different sides of the first flexible.

20 Claims, 6 Drawing Sheets

FLAT PANEL DISPLAY

CROSS-REFERENCE TO RELATED APPLICATION

This application claims the priority benefit of Taiwan application serial no. 97119183, filed on May 23, 2008. The entirety of the above-mentioned patent application is hereby incorporated by reference herein and made a part of this specification.

BACKGROUND OF THE INVENTION

1. Field of the Invention

The present invention generally relates to a display device or a panel, and in particular, to a flat panel display (FPD) or a flat panel with touch-sensing function (touch panel).

2. Description of Related Art

To meet the requirements of a modem product on high speed, high efficiency and compact design, all kinds of electronic components attempt to be developed towards miniaturization. Various portable electronic devices, such as notebooks, mobile phones, electronic dictionaries, personal digital assistants (PDAs), web pads, and tablet PCs have become the mainstream. In an image displays of portable electronic devices, flat panel displays have been widely used due to advantages of high space utilization, high display quality, low power consumption and no radiation, specifically, liquid crystal displays (LCDs) are preferred and widely used.

In general, an LCD comprises an LCD panel and a plurality of driver IC (integrated circuit) chips and other electrical components. The driver IC chips or electrical component are disposed on a glass substrate or a circuit board in many ways. The circuit board with the driver IC chips or the electrical components are disposed at the bottom of the LCD panel and electrically connected to the LCD panel through a flexible printed circuit (FPC). In addition, the driver IC chips or electrical components can be also disposed on a control circuit board in a portable electronic device, wherein the driver IC chips or the electrical components are also electrically connected to the LCD panel through an FPC. The driver IC chips usually mean IC chips used to drive thin film transistors of the LCD panel. In contrast, the electrical components are IC chips, some of which are used to drive a touch panel.

Along with the progress of display technology, an LCD panel in some applications is required to be synchronized with the operations to turn on and turn off a light source for providing a better display effect. To meet the demand of a user, other elements in an LCD are also required to be synchronized for operations with the displaying of the LCD panel, and therefore, the signals of the other elements in the LCD are conducted or processed by another FPC. The above-mentioned other elements includes, for example, a circuit to turn on and turn off the light source in the backlight module or a processing circuit in a touch panel to judge a touching position. Consequently, how to integrate a plurality of FPCs in a flat panel display to meet the requirements of consumers is an important project.

FIG. 1 is a diagram of a conventional LCD. Referring to FIG. 1, an LCD 100 includes an LCD panel 110, a first flexible printed circuit 120 and a second flexible printed circuit 130. The second flexible printed circuit 130 is usually used for controlling the display signals of the LCD panel 110, and the first flexible printed circuit 120 is usually used for controlling the operation signals of other elements, for example, control signal of a backlight module or touching-sensing signal of a touch panel. As shown in FIG. 1, the second flexible printed circuit 130 has a plurality of pads 122 arranged side by side, and the first flexible printed circuit 120 also has a plurality of pins 132 arranged side by side. Each of the pins 132 on the first flexible printed circuit 120 is respectively connected to a corresponding pad 122 on the second flexible printed circuit 130 so as to form a plurality of electrical connections 140 arranged side by side, as shown in FIG. 1.

In order to meet the requirements of consumers on the high resolution, the high response speed, the high contrast ratio of LCDs, and the function of the touch panel, the number of the electrical connections 140 between the second flexible printed circuit 130 and the first flexible printed circuit 120 is increased, so that the bonding area between the pins 132 and the pads 122 is not enough. In other words, if the bonding area keeps unchanged, the gap between every two adjacent electrical connections 140 must be decreased to meet the requirements of the high resolution, the high response speed, the high contrast, and the function of the touch panel, which likely makes two adjacent electrical connections 140 to be mutually bridged and short-circuited during soldering the pins 132 and the pads 122. As a result, the production yield of the LCD 100 is reduced.

SUMMARY OF THE INVENTION

Accordingly, the present invention is directed to a flat panel display having flexible printed circuits capable of increasing the number of electrical connections and avoiding short-circuited phenomenon between the electrical connections.

The present invention provides a flat panel display including a display screen, a first flexible printed circuit and a second flexible printed circuit. The second flexible printed circuit is electrically connected to the display screen and has a plurality of pads. The first flexible printed circuit is electrically connected between the display screen and the second flexible printed circuit. The first flexible printed circuit has a plurality of pins respectively corresponding to the pads, the pins are divided into a plurality of groups, and the groups are respectively located at the different sides of the first flexible printed circuit.

In an embodiment of the present invention, the above-mentioned display screen is a touch panel, wherein the second flexible printed circuit and the first flexible printed circuit are electrically connected to the touch panel.

In an embodiment of the present invention, the above-mentioned display screen is an LCD screen, wherein the LCD screen comprises an LCD panel having touch-sensing function as a touch panel and a backlight module, and the second flexible printed circuit and the first flexible printed circuit are electrically connected to the touch panel. The flat panel display can further include a third flexible printed circuit electrically connected between the backlight module and the second flexible printed circuit.

The above-mentioned LCD screen can include an LCD panel, a backlight module and a touch panel, wherein the LCD panel is electrically connected to the second flexible printed circuit, the backlight module and the touch panel are respectively disposed at opposite sides of the LCD panel and the first flexible printed circuit is electrically connected between the touch panel and the second flexible printed circuit. The flat panel display herein can further include a third flexible printed circuit electrically connected between the backlight module and the second flexible printed circuit, for example.

In an embodiment of the present invention, the ends of the above-mentioned pins are protruded from an edge of the first flexible printed circuit.

In an embodiment of the present invention, the ends of the above-mentioned pins are aligned with an edge of the first flexible printed circuit.

In an embodiment of the present invention, the above-mentioned second flexible printed circuit has a plurality of second positioning holes, the first flexible printed circuit has a plurality of first positioning holes and the second positioning holes are substantially aligned with the first positioning holes.

In an embodiment of the present invention, the above-mentioned flat panel display further includes a plurality of pre-soldering layers disposed on the pads.

In an embodiment of the present invention, the above-mentioned flat panel display further includes a plurality of solders, and each of the pins is bonded with one of the pads correspondingly through one of the solders.

In an embodiment of the present invention, the distance between any two pins within two different groups is greater than the gap of two adjacent pins within the same group.

The present invention also provides a flat panel display including a display screen and a first flexible printed circuit. The first flexible printed circuit is electrically connected to the display screen, and the first flexible printed circuit has a first side, a second side, a first group and a second group, wherein the first group has a plurality of first pins and the second group has a plurality of second pins. The first group is disposed at the first side, the second group is disposed at the second side and the first side is different from the second side.

In an embodiment of the present invention, the above-mentioned first side is an adjacent side of the second side.

In an embodiment of the present invention, the above-mentioned first group and the second group are arranged in an asymmetric way.

In an embodiment of the present invention, the ends of the above-mentioned first pins or second pins are aligned with the edge of the first flexible printed circuit.

In an embodiment of the present invention, the above-mentioned first pins and second pins are arranged alternately.

In an embodiment of the present invention, the above-mentioned first flexible printed circuit has a positioning hole. The first flexible printed circuit has an extension portion, the positioning hole is located, for example, on the extension portion and the extension portion has an axis, wherein the axis is located, for example, between the first group and the second group. The positioning hole is spaced from the axis by a predetermined distance and the axis is, for example, the central axis of the extension portion.

In an embodiment of the present invention, the above-mentioned flat panel display can include a plurality of solders respectively corresponding to the first pins and the second pins.

In an embodiment of the present invention, the above-mentioned solders enclose the ends of the first pins or the second pins.

In an embodiment of the present invention, the above-mentioned flat panel display further includes a second flexible printed circuit electrically connected to the display screen and the first flexible printed circuit, wherein the second flexible printed circuit includes a plurality of pads.

The present invention assigns the pins on the first flexible printed circuit and the corresponding pads into multiple groups and makes different groups disposed at the different sides of the first flexible printed circuit, so that the bonding space between the second flexible printed circuit and the first flexible printed circuit can be effectively utilized. In comparison with prior arts, the present invention is able to enhance the flexibility of the wiring layout between the flexible printed circuits and avoid short-circuited phenomenon between the pins.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
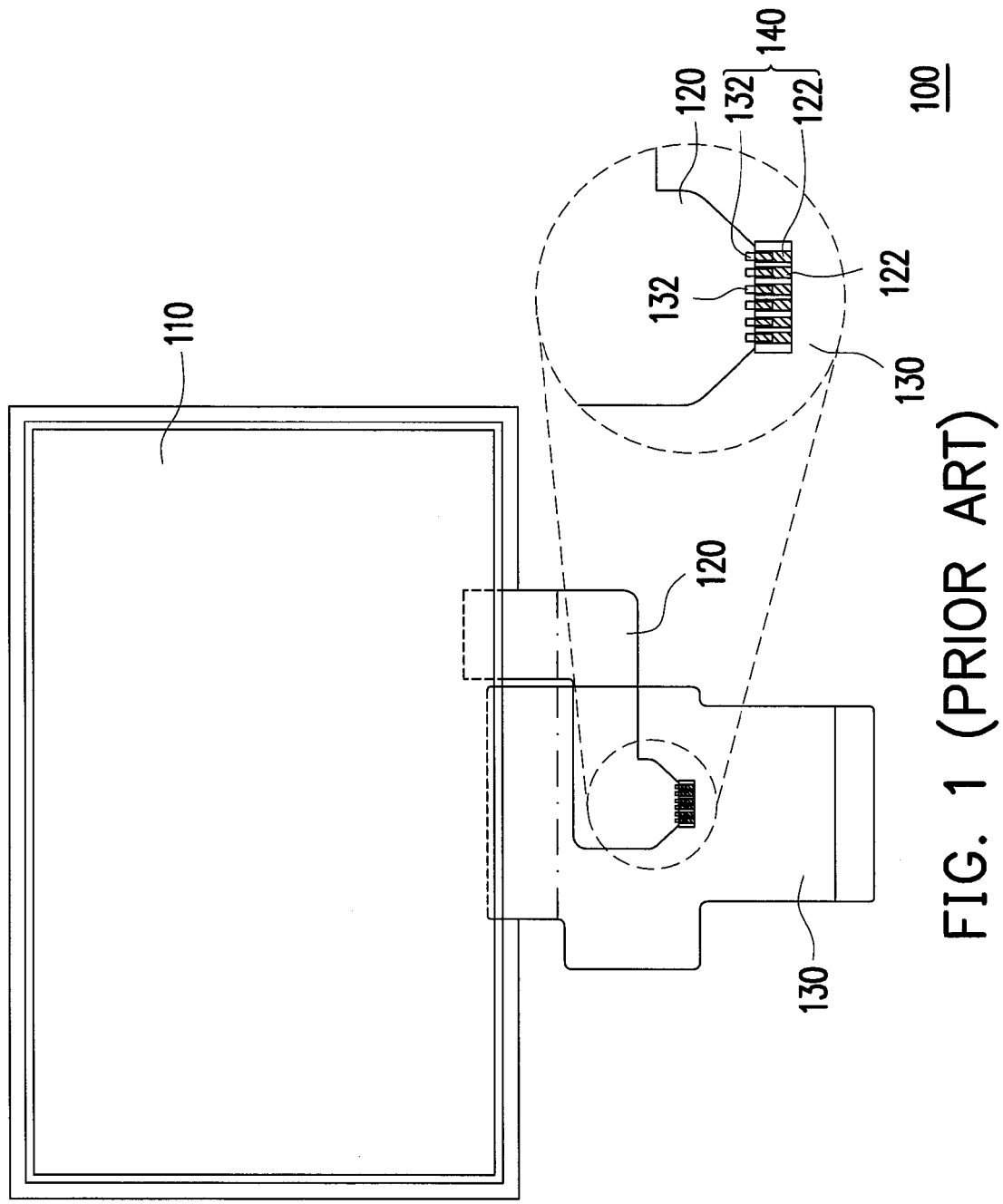
FIG. 1 is a diagram of a conventional LCD.

Reference will now be made in detail to the present preferred embodiments of the invention, examples of which are illustrated in the accompanying drawings. Wherever possible, the same reference numbers are used in the drawings and the description to refer to the same or like parts.

Figure 2:
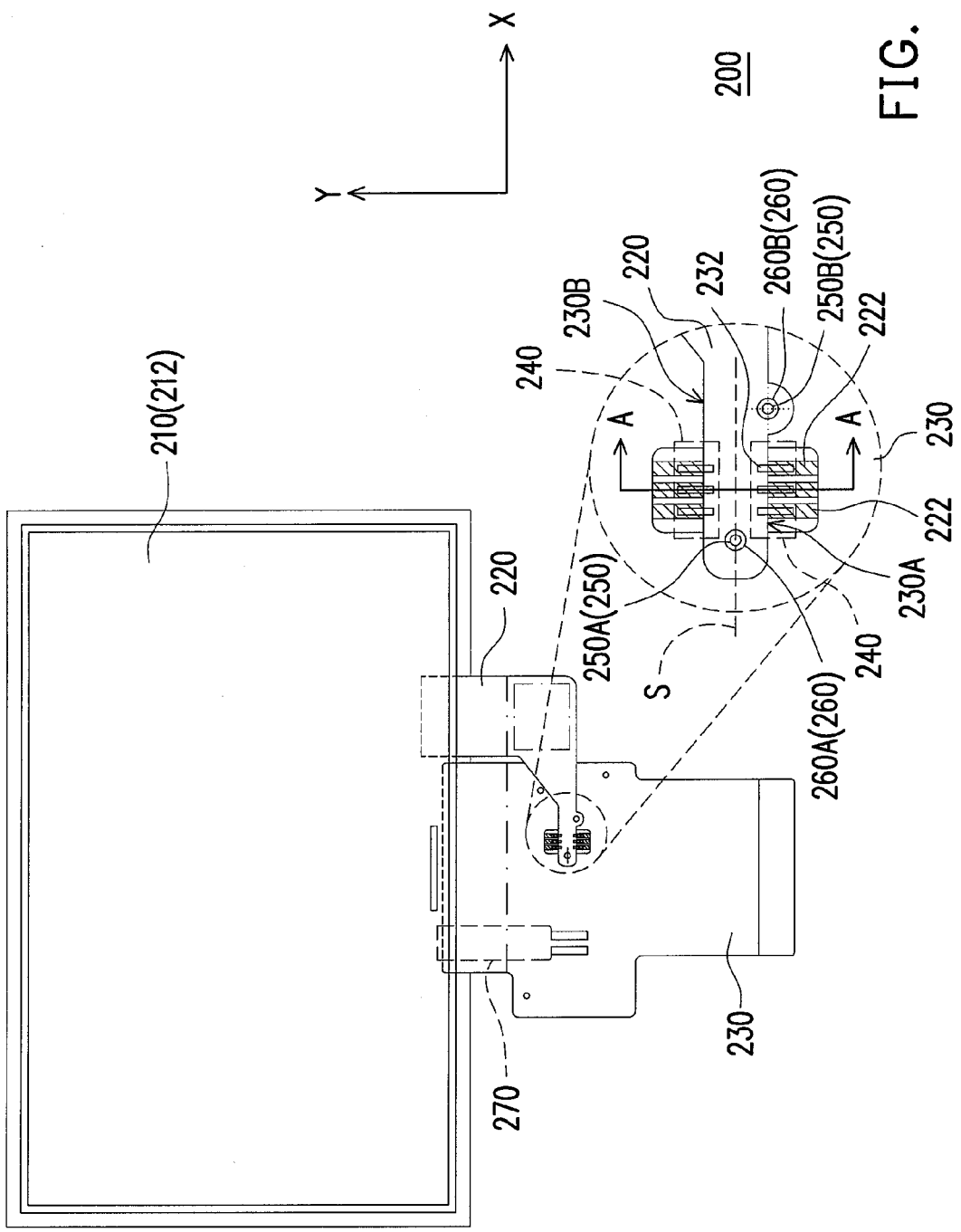
FIG. 2 is diagram of an LCD according to an embodiment of the present invention.

FIG. 2 is diagram of an LCD according to an embodiment of the present invention. Referring to FIG. 2, the flat panel display 200 of the present embodiment includes a display screen 210, a first flexible printed circuit 220 and a second flexible printed circuit 230. The second flexible printed circuit 230 is electrically connected to the display screen 210. The second flexible printed circuit 230 serves as a communication interface between the display screen 210 and an IC chip (not shown), and the second flexible printed circuit 230 has a plurality of pads 222. The first flexible printed circuit 220 is electrically connected between the display screen 210 and the second flexible printed circuit 230, wherein the first flexible printed circuit 220 has a plurality of pins 232 corresponding to the pads 222, the pins 232 are divided into a plurality of groups 240, and the pins 232 of the different group 240 are respectively located at the different sides of the first flexible printed circuit 220.

In a preferred embodiment, the pins 232 of the different group 240 are respectively and symmetrically disposed on two opposite sides 230A and 230B of the first flexible printed circuit 220. In this way, the pins 232 can be laid out flexibly, so that within a same bonding area the gap between two adjacent pads 222 can be increased to avoid short-circuited phenomenon due to an extreme small gap between two adjacent electrical connections.

In order to advance the bonding accuracy between the second flexible printed circuit 230 and the first flexible printed circuit 220, a plurality of first positioning holes 250 and a plurality of second positioning holes 260 are respectively located on the first flexible printed circuit 220 and the second flexible printed circuit 230. When the second flexible printed circuit 230 is bonded with the first flexible printed circuit 220, the first positioning holes 250 are substantially aligned with the second positioning holes 260.

In a preferred embodiment, as shown in FIG. 2, the first flexible printed circuit 220 includes an extension portion having an axis S, and the end of the extension portion is electrically connected to the second flexible printed circuit 230. The axis S is equivalent to the central axis of the extension portion. The first positioning hole 250A and the second positioning hole 260A are substantially located on the axis S, but the first positioning hole 250B and the second positioning hole 260B are substantially not located on the axis S and spaced from the axis S by a predetermined distance. In this way, it is prevented by disposing the above-mentioned first positioning holes 250 and the second positioning holes 260 to cause a deflection in the X-direction or Y-direction of the second flexible printed circuit 230 and the first flexible printed circuit 220 during bonding. In other words, the layout design of the first positioning holes 250, the second positioning holes 260 aligned with the first positioning holes 250, especially the first positioning hole 250B and the second positioning hole 260B, prevent the possible relative rotating between the first flexible printed circuit 220 and the second flexible printed circuit 230 from accruing, which further increases the bonding accuracy of the pins 232 and the pads 222.

The second flexible printed circuit 230 preferably carries a circuitry for transmitting the driving signal to the display screen 210 and the first flexible printed circuit 220 preferably carries a circuitry for transmitting the touch-sensing signal from the touch panel to the second flexible printed circuit 230. Through the integration of the second flexible printed circuit 230 and the first flexible printed circuit 220, the display screen 210 can synchronically display immediately when the touch panel is touched by the users. For example, the display screen 210 in FIG. 2 has a display panel 212 integrating touch-sensing function, the second flexible printed circuit 230 and the first flexible printed circuit 220 can be simultaneously electrically connected to the display panel 212 integrating touch-sensing function.

Figure 3A:
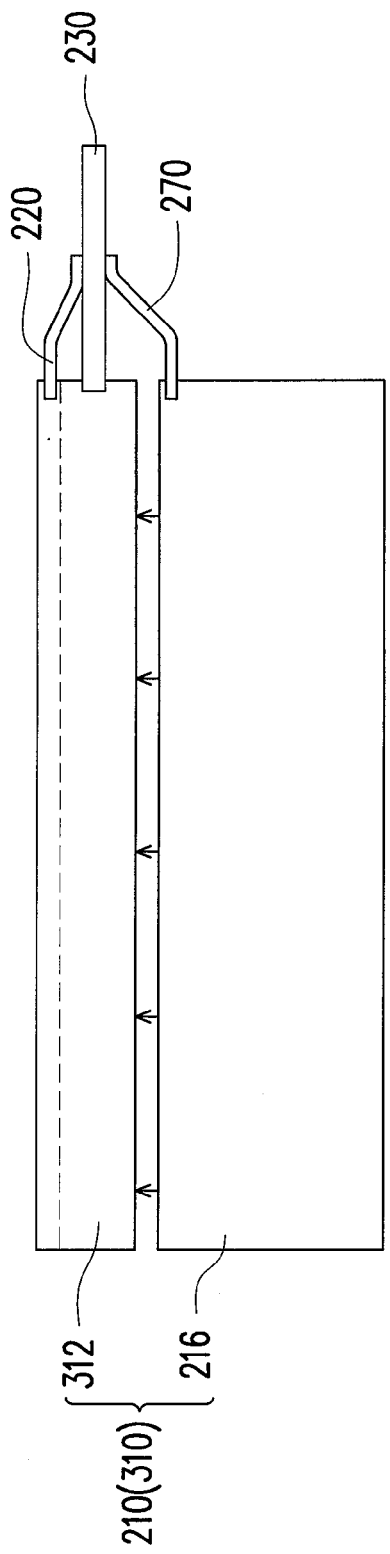
FIG. 3A is a cross-sectional diagram of an LCD according to an embodiment of the present invention.

FIG. 3A is a cross-sectional diagram of an LCD according to an embodiment of the present invention. Referring to FIG. 3A, in the embodiment, the display screen 210 in a flat panel display 300 is preferably an LCD screen 310 comprising an LCD panel 312 having touch-sensing function as a touch panel and a backlight module 216. Both the second flexible printed circuit 230 and the first flexible printed circuit 220 are electrically connected to the LCD panel 312 having touch-sensing function. The flat panel display 300 may further include a third flexible printed circuit 270, which is electrically connected to the backlight module 216 and the second flexible printed circuit 230. The relative position between the third flexible printed circuit 270 and the second flexible printed circuit 230 can refer to the top view in FIG. 2.

Figure 3B:
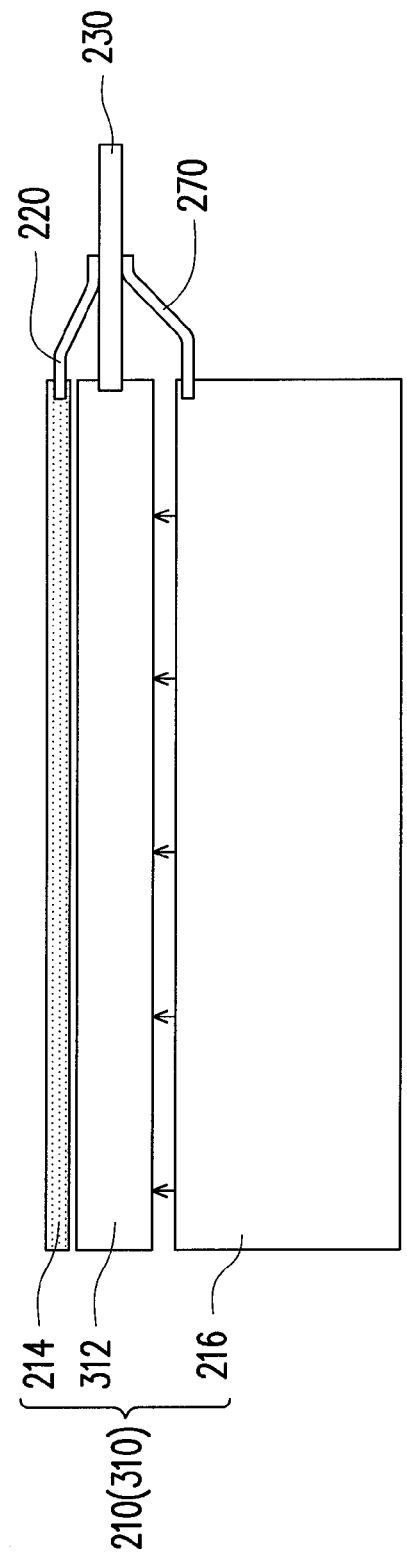
FIG. 3B is another cross-sectional diagram of an LCD according to an embodiment of the present invention.

FIG. 3B is another cross-sectional diagram of an LCD according to an embodiment of the present invention. Referring to FIG. 3B, the display screen 210 in a flat panel display 400 can be an LCD screen 310 comprising a touch panel 214, an LCD panel 312 and a backlight module 216. The backlight module 216 and the touch panel 214 are respectively disposed at opposite sides of the LCD panel 312. The LCD panel 312 is electrically connected to the second flexible printed circuit 230, and the touch panel 214 is electrically connected to the second flexible printed circuit 230 through the first flexible printed circuit 220. In the embodiment, the flat panel display 400 may further include a third flexible printed circuit 270 electrically connected to the backlight module 216 and the second flexible printed circuit 230. The relative position between the third flexible printed circuit 270 and the second flexible printed circuit 230 can refer to the top view in FIG. 2.

Figure 4:
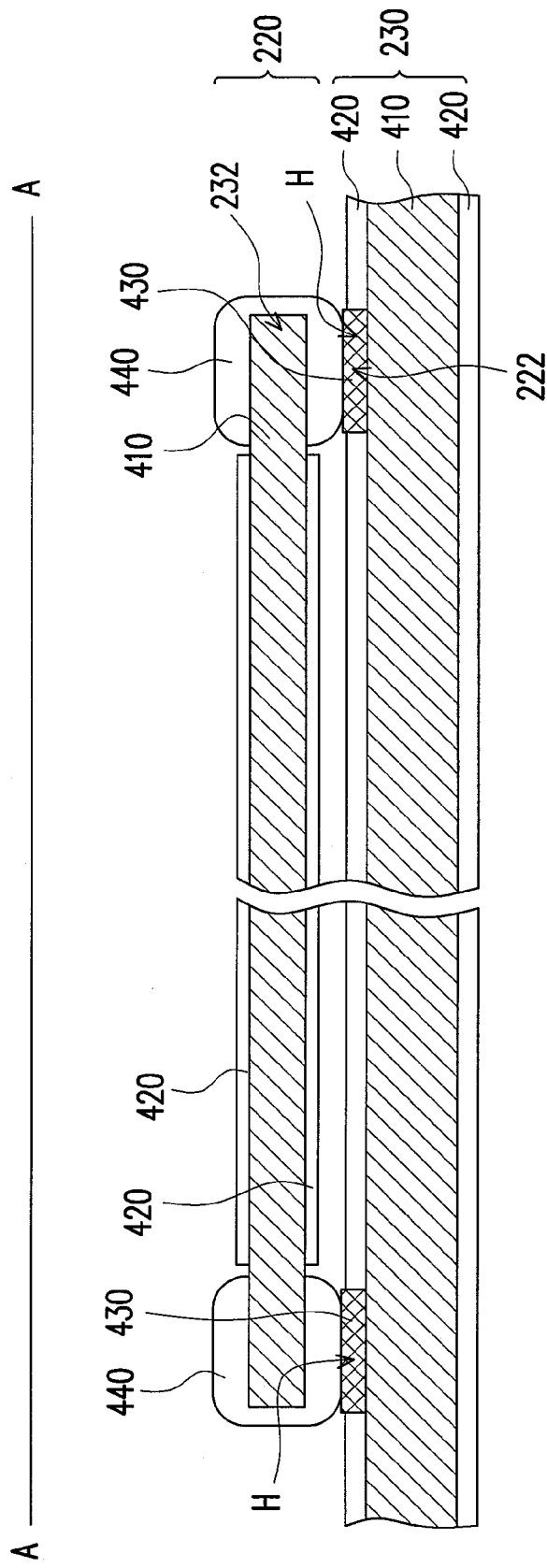
FIG. 4 is a cross-sectional diagram along the line A-A in FIG. 2.

FIG. 4 is a cross-sectional diagram along the line A-A in FIG. 2 illustrating how the second flexible printed circuit 230 in a flat display region of an embodiment of the present invention electrically connected to the first flexible printed circuit 220. Referring to FIG. 4, the second flexible printed circuit 230 or the first flexible printed circuit 220 comprises a conductive film 410 and insulation films 420 covering both sides of the conductive film 410. The conductive film 410 is preferably a copper foil and the insulation films 420 are preferably polyimide (PI) film. Referring to FIGS. 2 and 4, the insulation films 420 of the second flexible printed circuit 230 have a plurality of openings H located at the pads 222 so as to expose the conductive film 410. In the embodiment, the ends of the pins 232 of the first flexible printed circuit 220 are protruded from the edge of the first flexible printed circuit 220, and the pins 232 are located over the pads 222. In this way, the pins 232 of the first flexible printed circuit 220 can be soldered with the pads 222 of the second flexible printed circuit 230. Before the pins 232 of the first flexible printed circuit 220 are soldered with the pads 222 of the second flexible printed circuit 230, the pre-soldering layers 430 can be optionally formed on the pads 222 and the solder 440 is respectively formed between each of the pads 222 and the corresponding pin 232. After the pins 232 are soldered with the pads 222, the solders 440 encapsulate the ends of the pins 232. In this way, the soldering strength between the pads 222 and the pins 232 is increased, and the efficiency of transmitting signals between the pads 222 and the corresponding pins 232 is promoted.

Figure 5B:
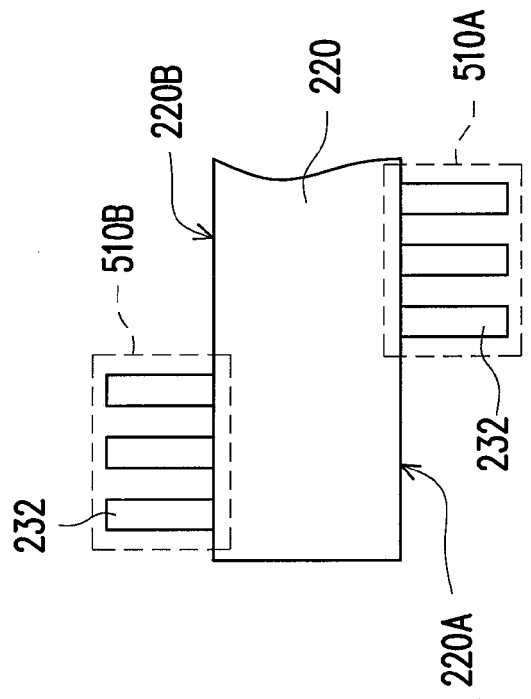
FIGS. 5A-5D are diagrams showing different layouts of pins in different embodiments of the present invention.
Figure 5A:
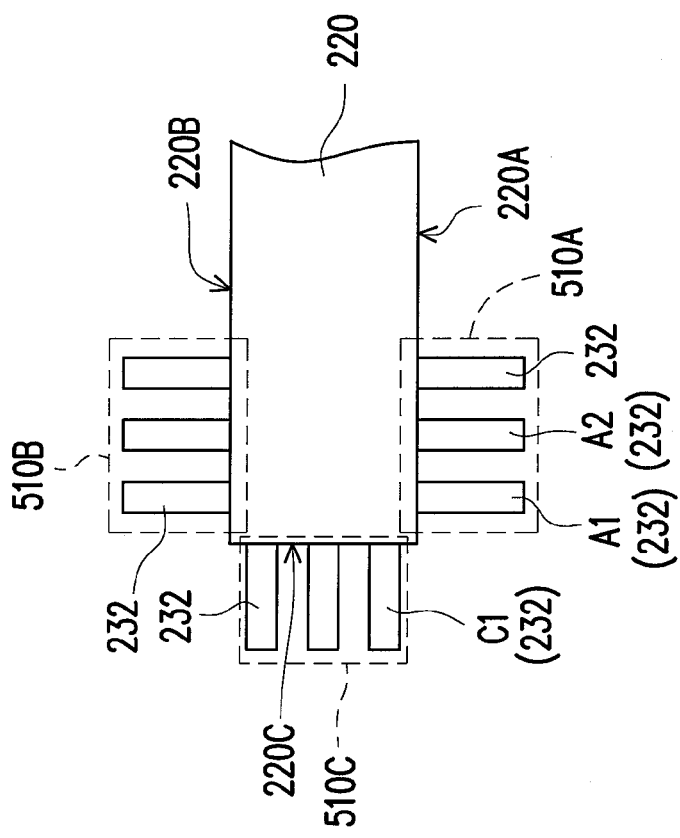

For some applications where the space utilization has a specific requirement, the pins 232 can be arranged more flexibly. FIGS. 5A-5D are diagrams showing different layouts of pins in different embodiments of the present invention. As shown in FIG. 5A, the pins 232 on the first flexible printed circuit 220 are divided into three groups 510A, 510B and 510C. The pins 232 of the groups 510A, 510B and 510C are arranged on two opposite sides 220A and 220B and a side 220C adjacent to the sides 220A and 220B of the first flexible printed circuit 220. The pins 232 of the groups 510A, 510B are symmetric to each other. In FIG. 5B, the pins 232 on the first flexible printed circuit 220 are divided into two groups 510A and 510B. The groups 510A and 510B are arranged in asymmetric way on two opposite sides 220A and 220B of the first flexible printed circuit 220. In FIG. 5C, the pins 232 within the group 510A and the pins 232 within the group 510B are arranged alternately on the opposite sides 220A and 220B of the first flexible printed circuit 220.

The pins 232 are divided into different groups 240 based on the distance between two adjacent pins 232. For example, the dividing rule is that the distance between two pins 232 belonging to different group 240 is greater than the gap between two adjacent pins 232 belonging to the same group 240. When the gap between two adjacent pins 232 is excessively large, in particular when the gap between the ends of two adjacent pins 232 is excessively large, the two pins 232 are assigned in two different group 240, which is shown by the pins A1 and C1 in FIG. 5A. On the contrary, when the gap between two adjacent pins 232 is within a predetermined range, in particular when the gap between the ends of two adjacent pins 232 is within the predetermined range, the two pins 232 are assigned in the same group 240, which is shown by the pins A1 and A2 in FIG. 5A. The predetermined range is varied with the product type and the space available for wiring.

Figure 5D:
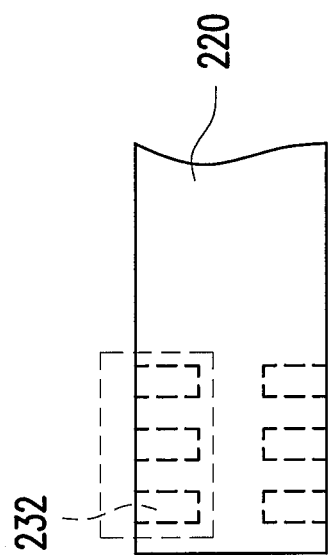
Figure 5C:
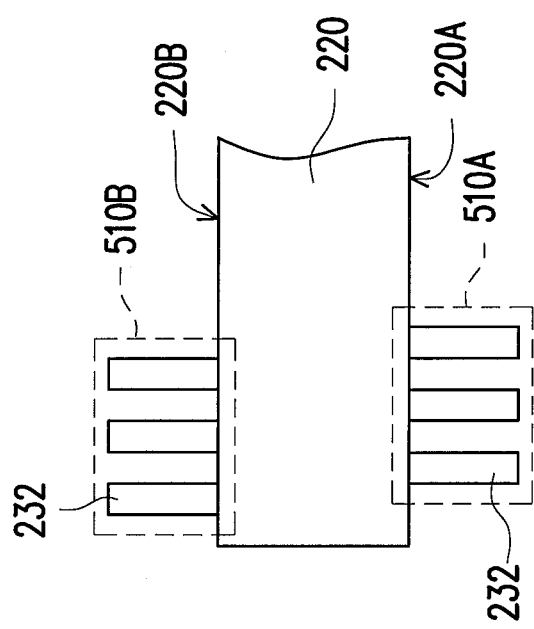

FIG. 5D is a diagram of another layout for the pins in an embodiment of the present invention. Referring to FIG. 5D, the ends of the pins 232 are aligned with the edge of the first flexible printed circuit 220, so that the wiring design on the second flexible printed circuit 230 and the first flexible printed circuit 220 has better flexibility to increase the design margin.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A flat panel display, comprising:
   a liquid crystal display (LCD) panel having a first surface and a second surface opposing the first surface;
   a touch panel disposed on the first surface of the LCD panel;
   a first flexible printed circuit electrically connected to the LCD panel, the first flexible printed circuit having a plurality of pins and an extension portion, wherein the pins are disposed at the extension portion, and the extension portion is not contact with the LCD panel; and
   a second flexible printed circuit having a plurality of pads corresponding to the pins, the second flexible printed circuit being electrically and directly connected to the LCD panel, wherein the pins are divided into a plurality of groups and each group is respectively located at the different sides of the extension portion of the first flexible printed circuit, and the first flexible printed circuit is integrated to the second flexible printed circuit through the pins and the pads.

2. The flat panel display according to claim 1, further comprising:
   a backlight module disposed on the second surface of the LCD panel.

3. The flat panel display according to claim 2, further comprising a third flexible printed circuit electrically connected between the backlight module and the second flexible printed circuit.

4. The flat panel display according to claim 1, wherein a distance between any two pins within two different groups is greater than the gap of two adjacent pins within the same group.

5. The flat panel display according to claim 1, wherein ends of the pins are aligned with or protruded from an edge of the first flexible printed circuit.

6. The flat panel display according to claim 1, wherein the pins are arranged in a symmetric way, an asymmetric way, or an alternate way.

7. The flat panel display according to claim 1, wherein the first flexible printed circuit has a positioning hole disposed at the extension portion.

8. The flat panel display according to claim 7, wherein the extension portion has an axis.

9. The flat panel display according to claim 8, wherein the axis is located between the groups.

10. The flat panel display according to claim 8, wherein the positioning hole is spaced from the axis by a predetermined distance.

11. The flat panel display according to claim 8, wherein the axis is a central axis of the extension portion.

12. A flat panel display, comprising:
    a liquid crystal display (LCD) panel having a first surface and a second surface opposing the first surface;
    a touch panel disposed on the first surface of the LCD panel;
    a first flexible printed circuit having a first end, a second end opposite to the first end, an extension portion, a plurality of first pins and a plurality of second pins, wherein the first end is electrically connected to the touch panel, the extension portion has an axis, and the extension portion extends from the second end of the first flexible printed circuit along the axis, a first edge of the extension portion is located at a side of the axis and a second edge of the extension portion is located at the other side of the axis, and the first edge and the second edge are not connected to each other, the first pins and the second pins are respectively disposed on the first edge and the second edge; and
    a second flexible printed circuit having a plurality of first pads and a plurality of second pads respectively corresponding to the first pins and the second pins, wherein the first pins contact with the first pads and the second pins contact with the second pads, and the second flexible printed circuit is electrically and directly connected to the LCD panel.

13. The flat panel display according to claim 12, further comprising:
    a backlight module disposed on the second surface of the LCD panel.

14. The flat panel display according to claim 12, further comprising a third flexible printed circuit electrically connected between the backlight module and the second flexible printed circuit.

15. The flat panel display according to claim 12, wherein a distance between any two pins of the first pins and the second pins is greater than the gap of two adjacent pins of the first pins and the second pins respectively.

16. The flat panel display according to claim 12, wherein ends of the first pins or the second pins are aligned with or protruded from an edge of the first flexible printed circuit.

17. The flat panel display according to claim 12, wherein the first pins are arranged in a symmetric way, an asymmetric way, or an alternate way, and the second pins are arranged in a symmetric way, an asymmetric way, or an alternate way.

18. The flat panel display according to claim 12, wherein the axis is a central axis of the extension portion.

19. The flat panel display according to claim 12, wherein the first flexible printed circuit has a positioning hole disposed at the extension portion.

20. The flat panel display according to claim 19, wherein the positioning hole is spaced from the axis by a predetermined distance.

* * * * *